United States Patent
Adachi et al.

[19]

[11] Patent Number: 5,812,028
[45] Date of Patent: Sep. 22, 1998

[54] AUDIO SIGNAL AMPLIFIER CIRCUIT AND A PORTABLE ACOUSTIC APPARATUS USING THE SAME

[75] Inventors: Kengo Adachi; Masanori Fujisawa; Masato Kobayashi, all of Kyoto, Japan

[73] Assignee: Rohm Co., Ltd., Kyoto, Japan

[21] Appl. No.: 783,201

[22] Filed: Jan. 14, 1997

[30] Foreign Application Priority Data

Jan. 16, 1996 [JP] Japan .................................. 8-023157

[51] Int. Cl.$^6$ ...................................................... H03F 3/45
[52] U.S. Cl. .......................................... 330/261; 381/120
[58] Field of Search .................................. 330/252, 257, 330/261, 256; 381/120; 323/316

[56] References Cited

U.S. PATENT DOCUMENTS

| | | | |
|---|---|---|---|
| 5,140,281 | 8/1992 | Fujisawa et al. | 330/261 |
| 5,256,984 | 10/1993 | Lee | 330/261 X |
| 5,299,008 | 3/1994 | Sadamatsu | 330/261 X |
| 5,488,330 | 1/1996 | Masuoka et al. | 330/261 |

*Primary Examiner*—Steven Mottola
*Attorney, Agent, or Firm*—Fay, Sharpe, Beall, Fagan, Minnich & McKee

[57] ABSTRACT

A differential amplifier circuit which has a pair of transistors capable of differential operation with a predetermined bias voltage and a predetermined bias current being set for the base is combined with a dummy circuit having a transistor with a substantially equivalent load to one member of said transistor pair and which is biased in an equivalent relationship to said one transistor, a current mirror in which the base of an input transistor is not diode connected but connected to the base of an output transistor and supplied at the collector or emitter with a drive current flowing to the base of said transistor in said dummy circuit and in which said output transistor supplies each of the bases of said pair of transistors with said bias current which is substantially equal to the current flowing to the base of said transistor in said dummy circuit, and a control circuit that is connected to the base of said transistor in said dummy circuit and which receives the base voltage of said transistor in said dummy circuit and said predetermined bias voltage to maintain the base of said transistor in said dummy circuit at said predetermined bias voltage.

10 Claims, 2 Drawing Sheets

AUDIO SIGNAL AMPLIFIER CIRCUIT AND A PORTABLE ACOUSTIC APPARATUS USING THE SAME

BACKGROUND OF THE INVENTION

This invention relates to an audio signal amplifier circuit and a portable acoustic apparatus using the same. More particularly, the invention relates to a preamplifier for use in low voltage driven portable acoustic apparatus such as portable magnetic tape players and CD (compact disc) players, said preamplifier being capable of direct drive on a small voltage comparative to one battery and for which a bias current can be set with precise offset cancellation.

Conventional portable magnetic tape players and CD players are usually driven on one or two dry cells. Hence, the supply voltage of audio amplifier circuits incorporated in these portable acoustic apparatus is only about 1.2–1.4 volts. In addition, most of these apparatus have a stereophonic capability and the circuit of their output stage consists of two channels.

The portable acoustic apparatus of these types must satisfy requirements for long play, compactness and small thickness. A common practice with these apparatus is that the voltage of one battery is increased with a suitable built-in booster such as a DC/DC converter to generate power of 2.4 volts or more, which is supplied to the apparatus.

In the case of low-voltage drive, the low supply voltage causes a problem with the offset of a bias current or voltage. In addition, an offset in a preamplifier which is to amplify a small signal causes a significant effect on an amplifier at the next stage due to the low signal level. To deal with this problem, the preamplifier in portable acoustic apparatus is often equipped with a bias current generator circuit for cancelling the offset (which is hereunder referred to as an "offset cancelling circuit").

FIG. 2 shows an exemplary audio amplifier circuit in a portable acoustic apparatus having a preamplifier which is to be driven on two batteries or on a single battery that is boosted to generate power of a voltage higher than 1.5 volts. The preamplifier has an offset cancelling circuit in the form of an integrated circuit.

Shown by 10 is an audio amplifier circuit including the preamplifier 1, which receives a small signal at an input terminal 3 as supplied from a signal generation source 2 which is typically a magnetic head or an associated head amplifier. Shown by 5 is a constant-voltage circuit provided in the preamplifier 1. Shown by 6 is an amplifier at the next stage which receives the amplified signal from the output terminal 4 of the preamplifier 1.

The preamplifier 1 consists of a differential amplifier 11 which amplifies an audio signal, an amplifier in the amplification stage 12 which receives the output of the differential amplifier, and the offset cancelling circuit (bias current generator circuit) 13. The differential amplifier 11 is composed of differential transistors Q1 and Q2 of NPN type, a transistor Q3 of NPN type serving as a constant-current source which is provided between the common junction of the emitters of Q1 and Q2 and the ground GND, and load transistors Q4 and Q5 of PNP type which are connected to the collectors of transistors Q1 and Q2, respectively, and which are interconnected in a current mirror fashion. The collectors of transistors Q1 and Q2 are connected to a supply line Vcc via transistors Q4 and Q5, respectively. Bias resistor R1 (or R2) is inserted between the base of transistor Q1 (or Q2) and a bias line Vb.

The collector of transistor Q2 having the load transistor Q5 is connected to the base of a PNP transistor Q6 in the amplifier 12 such that an amplified audio signal is delivered as an output from the differential amplifier 11. The collector of transistor Q6 is connected to the output terminal 4 so the output of the transistor Q6 is supplied as an input to the amplifier 6 at the next stage. As shown, the output terminal 4 is connected to the ground GND via a current source 14. A feedback resistor Rf is provided between the output terminal 4 and the base of the transistor Q2.

The constant-voltage circuit 5 is a series circuit of a constant-current source 15 and a diode-connected NPN transistor Q7, with the constant-current source 15 being connected between the supply line Vcc and the ground GND. The base potential of the NPN transistor Q7 is set at a constant voltage.

The offset canceling circuit 13 consists of a constant-current circuit 16 and a current mirror 17. The constant-current circuit 16 is a series circuit of a diode D (diode-connected transistor D), an NPN transistor Q8 and an NPN transistor Q9, with the series circuit being connected between the supply line Vcc and the ground GND. Since the base of transistor Q9 is connected to the base of transistor Q7 in the constant-voltage circuit 5, a constant current I flows into the series circuit 13.

The base of transistor Q7 is also connected to the base of transistor Q3 working as a constant-current source for the differential amplifier 11. Since transistors Q7 and Q3 have an emitter area ratio of 1:2, a constant current twice the value of I (2×I) will flow into transistor Q3. As a result, in a steady-state condition where the differential transistors Q1 and Q2 in the differential amplifier 11 are biased in a balanced way, an operating current I will flow into each transistor when no signal is applied.

Then, the current mirror 17 supplies equal values of bias current Ib to differential transistors Q1 and Q2 in the differential amplifier 11, thereby cancelling any offset in the flowing currents.

The current mirror 17 consists of a diode-connected PNP transistor Q10 on the input side and two PNP transistors Q11 and Q12 on the output side. The bases of the three transistors are connected together and the emitter of each transistor is connected to the supply line Vcc. The collector of input transistor Q10 is connected to the base of transistor Q8 so that in response to the current I flowing into the constant-current circuit 16, bias currents Ib of the same value are generated at the collectors of transistors Q11 and Q12. The collectors of transistors Q11 and Q12 are connected to the bases of transistors Q1 and Q2, respectively, causing a bias current Ib to flow into these bases. The flowing bias current Ib is equal to a base current flowing as constant current I into transistor Q8.

In a circuit of the configuration described above which allows bias currents of the same value to flow using a current mirror connection, a supply voltage higher than 1.5 volts is necessary since the transistor on the input side of the current mirror circuit is diode connected. To be more specific, the supply voltage Vcc should not be smaller than the sum of the operating voltage of transistor Q10, the operating voltage of transistor Q8 and Vsat, or the voltage of transistor Q9 when it is ON (i.e., the collector-emitter saturation voltage in ON state). Substituting actual data, a minimal value of Vcc is 1.6 V (=0.7 V+0.7 V+0.2 V) or more. Therefore, although not shown, two batteries are necessary for direct drive of an audio amplifier circuit including the preamplifier described above. If one battery is to be used, a booster circuit is necessary and this results in increased power consumption.

On the other hand, with an amplifier circuit that can be driven on a low voltage comparable to 1.5 V to amplify a small signal in an amplifier, even a small variation in the supply voltage will cause a substantial effect on the bias current; in addition, drifts in the bias voltage and current due to temperature changes will cause by no means negligible effects on sound quality. Thus, it has been difficult to realize an amplifier circuit that can be directly driven on a voltage comparable to one battery and which yet produces sound of high quality.

SUMMARY OF THE INVENTION

The present invention has been accomplished under these circumstances and has as an object providing an audio signal amplifier circuit that can be driven directly on a low voltage comparable to one battery and which is also capable of setting a bias current that cancels any current offset.

Another object of the invention is to provide a portable acoustic apparatus having a preamplifier that can be driven directly on a low voltage comparable to one battery.

The first object of the invention can be attained by an audio signal amplifier circuit comprising a differential amplifier circuit which has a pair of transistors capable of differential operation with a predetermined bias voltage and a predetermined bias current being set for the base and which receives an audio signal to amplify the same and a bias current generator circuit that supplies the bases of said pair of transistors with bias currents of substantially the same value, said bias current generator circuit comprising:

a dummy circuit having a transistor with a substantially equivalent load to one member of said transistor pair and which is biased in an equivalent relationship to said one transistor;

a current mirror in which the base of an input transistor is not diode connected but connected to the base of an output transistor and supplied at the collector or emitter with a drive current flowing to the base of said transistor in said dummy circuit and in which said output transistor supplies each of the bases of said pair of transistors with said bias current which is substantially equal to the current flowing to the base of said transistor in said dummy circuit; and a control circuit that is connected to the base of said transistor in said dummy circuit and which receives the base voltage of said transistor in said dummy circuit and said predetermined bias voltage to maintain the base of said transistor in said dummy circuit at said predetermined bias voltage.

The dummy circuit has a transistor with a substantially equivalent load to a differential transistor and which is biased in an equivalent relationship to said differential transistor and the current flowing to the base of the transistor in the dummy circuit is used as a reference for the bias current such that the current mirror produces two current values equal to this reference value, which are supplied as the bias current to the bases of the pair of differential transistors.

Thus, the value of the current supplied to each differential transistor always agrees with the value of the current to the base of the transistor in the dummy circuit without any offset being caused to the currents flowing to the differential amplifiers.

In order to suppress the changes that may occur in the base voltage of each differential transistor on account of variations in the supply voltage or temperature changes, the control circuit performs the necessary control to maintain the base voltage of the transistor in the dummy circuit at the predetermined bias voltage (the reference bias voltage). The transistor in the dummy circuit has an equivalent load to one of the differential amplifiers and is biased in an equivalent relationship to the latter and, therefore, if the base voltage of the transistor in the dummy circuit is maintained at a constant level, the voltage at the bases of the differential transistors which are supplied with a base current of the same value is also maintained at a constant value equal to the base voltage of the transistor in the dummy circuit. As a result, offset cancelling is realized in such a way that no adverse effects are caused by variations in the supply voltage or temperature changes.

The current mirror produces a current of the same value as the base current flowing to the transistor in the dummy circuit and its input transistor is not diode-connected. Needless to say, the output transistor in the current mirror is not diode-connected. Therefore, a drive voltage greater than 1 Vf is not necessary to operate the current mirror. Stated specifically, the operating voltage of the current mirror can be reduced by about 0.5 volts compared to the voltage required to drive the existing diode-connected current mirror circuit, as calculated by: 1 Vf (voltage drop in forward direction between base and emitter)–Vsat (ON saturation voltage between collector and emitter). As a result, small signals can be precisely amplified on a power supply that is driven with a low voltage comparable to 1.5 volts and this facilitates the fabrication of a preamplifier that can be directly driven with a voltage comparable to one battery for amplification of sound of high quality.

In the preferred embodiment to be described hereunder, the dummy circuit includes a constant-current circuit that has an equivalent load in an equivalent bias relationship with one of the differential transistors on the signal input side of the differential amplifier circuit which performs the amplification of audio signals and this constant-current circuit supplies the transistor in the dummy circuit with an operating current I of the same value as the operating current flowing to the differential amplifiers when no signal is supplied. The control circuit in the embodiment is an error amplifier composed of a differential amplifier circuit and the base current of the transistor which is to receive the signal detected with the differential amplifier of the error amplifier is set at a sufficiently smaller value than the bias current flowing to the transistor in the dummy circuit that there will occur only a minimum deviation from the bias current and voltage to the differential transistors.

DESCRIPTION OF THE PREFERRED EMBODIMENT

Figure 1:
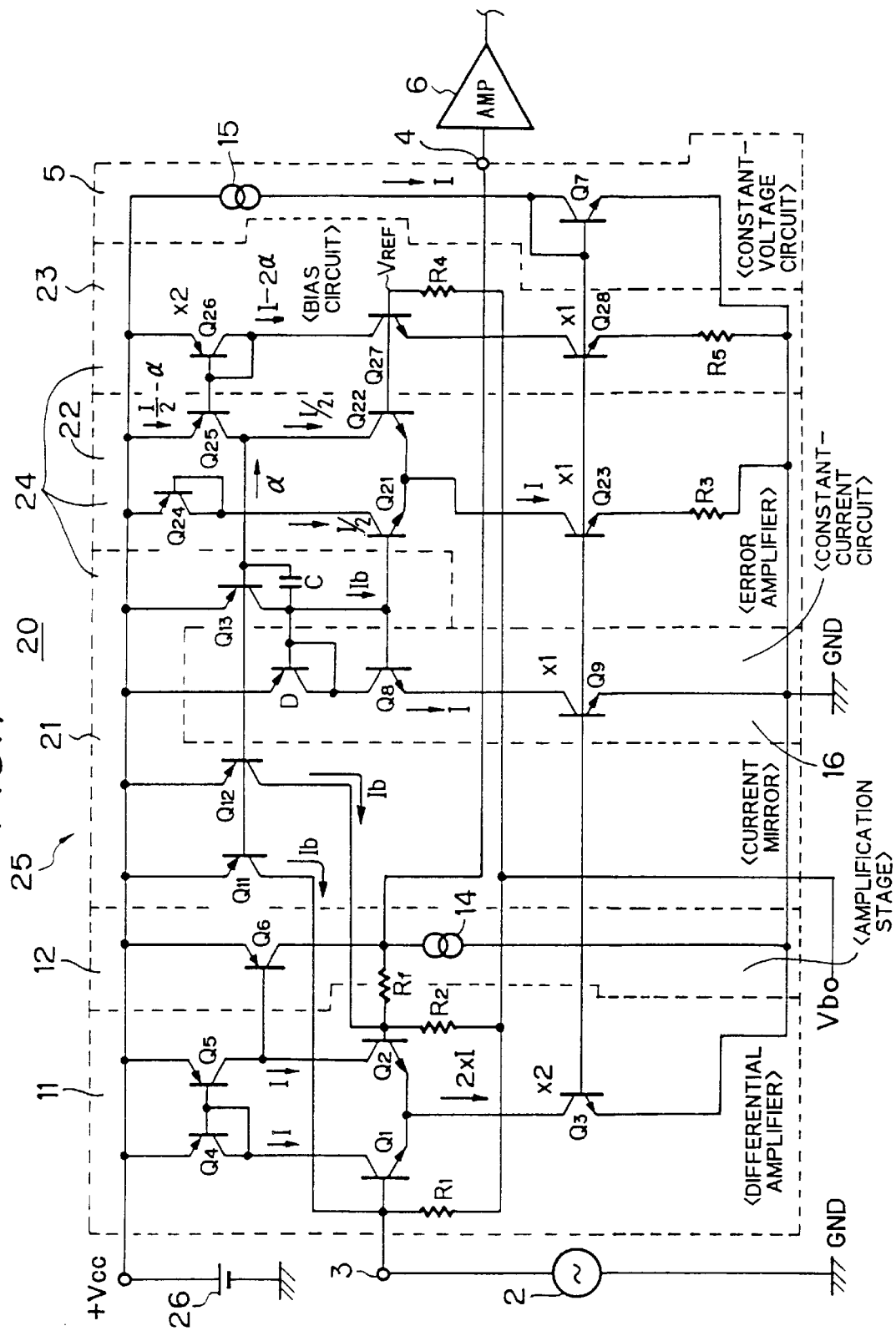
FIG. 1 is a block diagram of an exemplary small audio signal amplifying circuit having an offset cancelling bias circuit according to the invention.

Shown by 25 in FIG. 1 is a preamplifier which is driven on a single battery 26. The preamplifier 25 combines with an amplifier in the next stage 6 and other components to make an audio signal amplifier circuit 20. The preamplifier 25 in the preferred embodiment under discussion substitutes an offset cancelling circuit 24 for the offset cancelling circuit 13 shown in FIG. 2. The other parts of the system shown in FIG. 1 are identical to those shown in FIG. 2 and identified by like numerals. For the sake of convenience in explanation of the offset cancelling circuit (i.e., bias current generation circuit) 24 which has an increased number of components, the constant-voltage circuit 5, differential amplifier 11 and amplifier 12 in the amplifying stage are shown in FIG. 1 in different positions than in FIG. 2. It should also be noted that in FIG. 1, the base of transistor Q8 in the constant-current circuit 16 is connected to the offset cancelling circuit 24 such that the base current and voltage of transistor Q8 are equal to those of each of transistors Q1 and Q2 in the differential amplifier 11.

Figure 2:
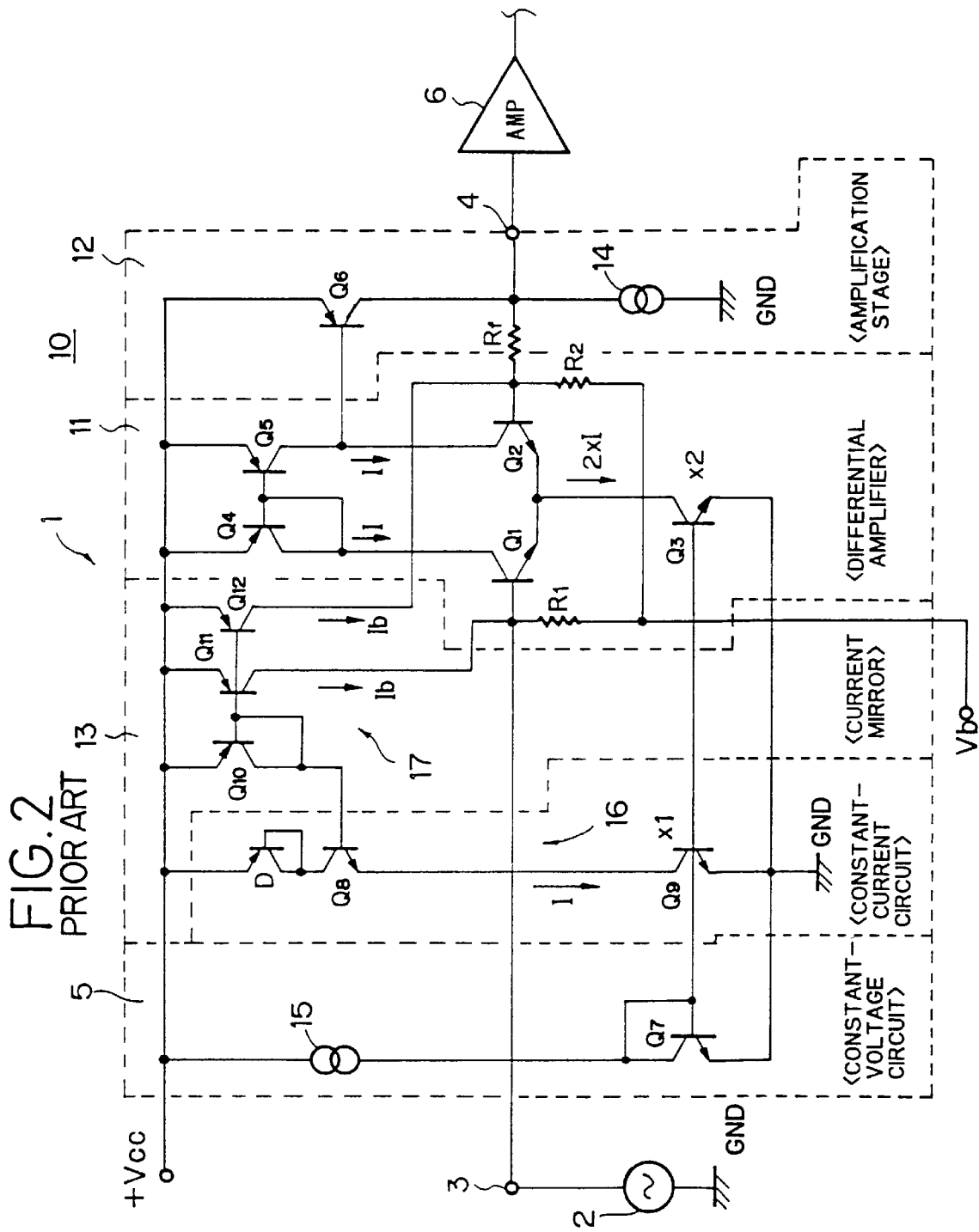
FIG. 2 is a block diagram of a small audio signal amplifying circuit having a conventional offset cancelling bias circuit.

The offset cancelling circuit 24 is composed of a current mirror 21, an error amplifier 22 and a bias voltage generation circuit 23 (hereunder referred to simply as a "bias circuit" 23). The current mirror 21 is a substitute for the current mirror 17 shown in FIG. 2. The diode-connected transistor Q10 on the input side of current mirror 17 is replaced by an input transistor Q13 that is not diode-connected in the current mirror 21. Because of this configuration, transistor Q13 is driven in response to a current I which, as in the system shown in FIG. 2, is caused to flow into said transistor by means of the constant-current circuit 16. It should also be noted that transistor Q13 has the same bias voltage as transistors Q11 and Q12. Hence, the transistor Q13 in the current mirror 21 is used as an input transistor whereas the transistors Q11 and Q12 are used as output transistors which, as in the system shown in FIG. 2, are allowed to output bias currents of the same value Ib.

A capacitor C is connected between the base and the collector of transistor Q13 in order to have a high-frequency component bypass said transistor.

In the embodiment under consideration, the base voltage of drive transistor Q8 in the constant-current circuit 16 is controlled to be equal to a reference bias voltage $V_{REF}$ (hereunder referred to as "reference voltage" $V_{REF}$) for the bases of transistors Q1 and Q2 in the differential amplifier 11 which is the main part of the preamplifier. To accomplish this, the base of transistor Q8 is connected to the base of transistor Q21 in the error amplifier 22 and the error amplifier 22 performs feedback control in such a way that a control current that causes the base voltage of transistor Q8 to become equal to the base voltage (reference voltage $V_{REF}$) of transistor Q22 which pairs with transistor Q21 is generated at the collector of transistor Q22 and caused to flow to the base of transistor Q13.

Thusly, the base voltage of transistor Q8 is maintained at reference voltage $V_{REF}$. In this connection, it should be mentioned that the base of transistor Q22 is connected to the base of a transistor Q27 in a bias circuit 23 which generates the base reference voltage $V_{REF}$ so that the base of transistor Q27 is set to be equal to the reference voltage $V_{REF}$. Needless to say, the reference voltage $V_{REF}$ is applied from a bias line Vb to the bases of transistors Q1 and Q2 in the differential amplifier so that the base potentials of these transistors are also set to be equal to the reference voltage $V_{REF}$. Details of the feedback control to be performed by the error amplifier 22 will be given later in this specification.

The circuit configuration just described above makes the base potential of transistor Q8 equal to the base potentials of transistors Q1 and Q2. In addition, the current mirror 21 causes the same base current to flow into these transistors. Transistor Q8 has a diode-connected transistor D as an equivalent load to load transistor Q4 in the differential transistor Q1. Furthermore, the operating current I flowing through the transistor Q8 is equal to the current flow through each of the differential amplifiers Q1 and Q2 when no signal is applied. Thus, the transistors Q8 has substantially the same bias voltage as both differential transistors Q1 and Q2.

Because of this configuration, the constant-current circuit 16 serves as a dummy circuit which performs an equivalent operation to differential transistor Q1 or Q2.

In an IC of the type discussed herein, transistor Q8 is integrated as a pair transistor with respect to differential transistors Q1 and Q2. Similarly, diode-connected transistor D is integrated as a pair transistor with respect to transistors Q4 and Q5.

In the system configuration described above, the bases of transistors Q1 and Q2 in the differential amplifier 11 are set to have the reference voltage $V_{REF}$ and in spite of variations in the supply voltage and other operating parameters, bias currents of the same value that maintain the reference voltage will be applied to the bases of those transistors. The reason is that a current (bias current Ib) of substantially the same value as the current which flows through the base of transistor Q8 when it is maintained at the reference voltage $V_{REF}$ is allowed to flow to the bases of transistors Q1 and Q2 by means of the current mirror 21.

The base voltage of transistor Q8 is compared with the reference voltage $V_{REF}$ set by the error amplifier 22, which performs feedback control in such a way that the base voltage of transistor Q8 will be maintained at $V_{REF}$ in spite of variations in the supply voltage and other operating parameters. The bias current Ib which flows to transistors Q1 and Q2 under this feedback control is of such a value that the base voltage of transistor Q8 is maintained at the reference voltage $V_{REF}$. If the current flowing to the base of each of transistors Q1, Q2 and Q8 is equal to the bias current Ib, collector-emitter currents of substantially the same value (I) will flow to these transistors when no signal is applied and, hence, the bias current Ib maintains the bias voltages of transistors Q1 and Q2 to be equal to the base voltage of transistor Q8.

The feedback control to be performed by the error amplifier 22 will now be described with reference to its result, namely, the base voltage of transistor Q8 being maintained at the reference voltage $V_{REF}$. The following description assumes that the operating current for performing the feedback control of interest is of such a small value that it can safely be neglected in comparison with the bias current Ib.

The error amplifier 22 is a differential amplifier having NPN differential transistors Q21 and Q22. A series circuit of an NPN transistor Q23 working as a constant-current source and a resistor R3 is provided between the common junction of the emitters of transistors Q21 and Q22 and the ground GND. A diode-connected PNP load transistor Q24 is provided between the collector of transistor Q21 and the supply line Vcc, and a PNP load transistor Q25 is provided between the collector of transistor Q22 and the supply line Vcc.

In the circuit configuration just described above, the operating current of the differential amplifier 22 which flows into the transistor Q23 is set by the resistor R3 located downstream of said transistor, whereby the base current of transistor Q21 can be held small compared to the bias current Ib.

The collector of transistor Q22 is connected to the base of transistor Q13 so that the latter is supplied with a feedback of an error output from the error amplifier 22. The base of the input transistor Q21 is connected to the base of transistor Q8. With this arrangement, an error current output proportional to the difference between the base voltage of transistor Q8 and the reference voltage $V_{REF}$ is applied to the base of transistor Q13, whereupon the base voltage of transistor Q8 is controlled to become equal to $V_{REF}$. Since transistor Q13 is an input transistor in the current mirror 21, the bias currents delivered from output transistors Q11 and Q12 are subject to the same control as described above, whereby transistors Q1 and Q2 are controlled to follow the state of transistor Q8. In other words, transistor Q8 works as a reference transistor which sets transistors Q1 and Q2 in the desired state.

The bias circuit 23 which generates the reference voltage $V_{REF}$ has a diode-connected PNP transistor Q26, downstream NPN transistors Q27 and Q28, and a resistor R5 connected in the order written and it is connected between the supply line Vcc and the ground GND. The transistor Q26 is connected to the load transistor Q25 in a current mirror fashion, and the resistor R5 is provided on the emitter side of NPN transistor Q28.

The base of transistor Q28 is connected to the base of transistor Q7 in the constant-voltage circuit 5 so that a current I will flow into transistor Q28 but the actual value of the current flowing through the transistor Q28 is set by the downstream resistor R5. In the case under consideration, the value of resistor R5 sets a current value of I–2α. The reference voltage $V_{REF}$ is set by the relationship it has with the value of the current that is supplied from the bias line Vb to flow to the base of transistor Q27 via a resistor R4. Similarly, the reference voltage $V_{REF}$ for the bases of transistors Q1 and Q2 are set by the relationship they have with resistors R1 and R2. Letter α represents the total sum of the currents flowing out of the bases of those transistors in order to drive transistors Q11, Q12 and Q13 in the current mirror 21.

The overall operation of the offset cancelling circuit 24 will now be described, with the value of current adjusting resistor R3 being neglected (assumed to be zero) for the sake of convenience in explanation. As already mentioned, the base of transistor Q23 is connected to the base of NPN transistor Q7 in the constant-current circuit 5 so that current I will flow to both transistors. The base voltage of differential transistor Q21 is set to the reference voltage $V_{REF}$ for the differential amplifier 11 since the base voltage of differential transistor Q22 is set to the same reference voltage $V_{REF}$ by means of the bias circuit 23. Hence, a current of the value I/2 will flow to each of transistors Q21 and Q22 in a steady-state condition.

Suppose here that the emitter area ratio of transistors Q26 and Q25 is 2:1. As already mentioned, a current of the value I–2α flows into transistor Q28, so a current of the same value will flow into the diode-connected PNP transistor Q26, whereupon a current of I/2–α will flow into the load transistor Q25 which is connected in a current mirror fashion and driven by transistor Q26, causing a current of I/2 (which is the sum of I/2–α and α, or the drive current for the current mirror) to flow into transistor Q22.

In the system shown in FIG. 1, the base of transistor Q27 has a common junction with the base of transistor Q22 and, as in the case of the bases of transistors Q1 and Q2, the bases of transistors Q27 and Q22 are connected to the bias line Vb via resistor R4. Because of this wiring, the base voltages of transistors Q1, Q2, Q22 and Q27 are set to be equal to the reference voltage $V_{REF}$ by means of the bias line Vb when no signal is applied (in terms of static characteristics). As a result, the base voltage of transistor Q22 becomes equal to the reference voltage $V_{REF}$ and the error amplifier 22 controls transistors Q8 and Q21 to have a base voltage equal to the specified reference voltage $V_{REF}$.

Thusly, the base voltage of transistor Q21 in the differential amplifier 21 is set to be equal to the reference value $V_{REF}$, providing transistors Q1 and Q2 with a base voltage which is substantially equal to the base voltage supplied to transistor Q8. As a consequence, these transistors are supplied with substantially equal values of base voltage and current.

Suppose here that the base voltage of transistor Q8 varies to produce a difference between the base voltage of transistor Q21 and that of transistor Q22. The difference is amplified as an error, causing an error current to be delivered to the collector of transistor Q22 and thence supplied to the base of transistor Q13. This action restores the base voltage of transistor Q21 towards the reference voltage $V_{REF}$. As a result, the base of transistor Q8 is supplied with a bias current that maintains its voltage at the reference level $V_{REF}$. At the same time, the bases of transistors Q1 and Q2 are supplied with a current that maintains their voltage at the reference level $V_{REF}$.

If, for example, the base voltage of transistor Q21 becomes higher than the reference value, the value of the current flowing into that transistor which has been I/2 increases to I/2+β, whereupon the current flowing to transistor Q22 will accordingly decrease to I/2–β. Since the current flowing to transistor Q25 has a value of I/2–α, a current equal to (α–β) will flow to the base of transistor Q13, whereupon the base current of transistor Q13 will decrease to lower the base voltage of transistor Q21 until it becomes equal to the reference value $V_{REF}$.

If the base voltage of transistor Q21 becomes lower than the reference value $V_{REF}$, the foregoing operation will be reversed and a current equal to (α+β) will flow to the base of transistor Q13, whereupon the base voltage of transistor Q21 is increased until it becomes equal to the reference value $V_{REF}$.

Thus, the error amplifier 22 performs feedback control on transistor Q13 in such a way that the base voltage of transistor Q8 having a common junction with the base of transistor Q21 becomes equal to the reference voltage $V_{REF}$; as a result, even if the current mirror 21 having transistor Q13 on the input side causes a variation in the circuit that will change the base current of transistor Q8, the bases of transistors Q1 and Q2 will be subjected to the same control as described above.

It should be mentioned here that the constant-current circuit 16 is a dummy circuit of a configuration completely identical to the arrangement of transistors on one side of the differential amplifier 11. Transistor Q8 in the constant-current circuit 16 is a pair transistor equivalent to transistors Q1 and Q2. Hence, a variation in the base voltage of transistor Q8 due to a variation in temperature or supply voltage will cause a corresponding variation to transistors Q1 and Q2. Under the circumstances, any variations in the state of transistor Q8 due to changes in the state of the circuit such as a variation in the supply voltage is subject to feedback control by the error amplifier 22 such that the base voltage becomes equal to the reference value $V_{REF}$. This eliminates the possibility of offsetting of transistors Q1 and Q2 even if a variation in the supply voltage or other phenomena occur that change the state of the circuit.

The current mirror 21 does not use a diode-connected drive circuit, so the supply voltage used in the system shown in FIG. 1 can be reduced by an amount equal to (1 Vf–Vsat), as illustrated by the following calculation: the operating voltage of transistor Q13+the operating voltage of transistor Q8+Vsat, or the voltage of transistor Q9 when it is ON=0.2 V+0.7 V+0.2 V=1.1 V.

Thus, the preamplifier according to the invention provides an audio signal amplifier circuit that can be driven on 1.5 volts or less and which has an offset canceled bias setting to make it immune against temperature and voltage variations.

The foregoing description has assumed that resistor R4 has a negligibly small resistance; however, since the base of transistor Q8 has a common junction to the base of transistor Q21, part of the current Ib flowing between the emitter and the collector of transistor Q13 flows to the base of transistor Q21, creating a corresponding imbalance with the base current flowing to each of transistors Q1 and Q2. To deal with this problem, the resistances of resistors R4 and R3 are increased to ensure that the base current of transistor Q21 is sufficiently smaller than the base current of transistor Q8. This design modification will cause no practical problem since the error amplifier 22 controls a small base current and can be operated on a very small current.

If the supply voltage is negative rather than positive which has been assumed in the foregoing description or if the bias voltage permits, each of the PNP transistors used in the preferred embodiment may be replaced by an NPN transistor and vice versa.

What is claimed is:

1. An audio signal amplifier circuit comprising a differential amplifier circuit which has a pair of transistors capable of differential operation with a predetermined bias voltage and a predetermined bias current being set for the base and which receives an audio signal to amplify the same and a bias current generator circuit that supplies the bases of said pair of transistors with bias currents of substantially the same value, said bias current generator circuit comprising:

a dummy circuit having a transistor with a substantially equivalent load to one member of said transistor pair and which is biased in an equivalent relationship to said one transistor;

a current mirror in which the base of an input transistor is not diode connected but connected to the base of an output transistor and supplied at the collector or emitter with a drive current flowing to the base of said transistor in said dummy circuit and in which said output transistor supplies each of the bases of said pair of transistors with said bias current which is substantially equal to the current flowing to the base of said transistor in said dummy circuit; and a control circuit that is connected to the base of said transistor in said dummy circuit and which receives the base voltage of said transistor in said dummy circuit and said predetermined bias voltage to maintain the base of said transistor in said dummy circuit at said predetermined bias voltage.

2. An audio signal amplifier circuit according to claim 1, wherein two output transistors are provided such that they are respectively associated with the two members of said transistor pair to supply said bias current to each of the bases of said transistors.

3. An audio signal amplifier circuit according to claim 2, wherein said differential amplifier circuit has a first constant-current circuit for setting the operating current of said transistor pair, said dummy circuit has a second constant-current circuit for setting the operating current of the transistor in said dummy circuit, the current value of said second constant-current circuit is set to be substantially one half the current value of said first constant-current circuit, and said control circuit is an error amplifier which generates an error consisting essentially of the difference between the base voltage of said transistor in said dummy circuit and said predetermined bias voltage and wherein a signal representing said error is sent to the base of said input transistor.

4. An audio signal amplifier circuit according to claim 3, which further includes a bias circuit for generating said predetermined bias voltage, said error amplifier is composed of a differential amplifier circuit having a first and a second transistor and a third constant-current circuit for setting the operating current of this pair of transistors, the base of said first transistor being connected to the base of said transistor in said dummy circuit, the base of said second transistor being connected to a terminal of said bias circuit for generating said predetermined bias voltage, and wherein the output of said second transistor is sent to the base of said input transistor and the current value of said third constant-current circuit is set such that a current sufficiently smaller than the current flowing to the base of said transistor in said dummy circuit will flow to the base of said first transistor.

5. An audio signal amplifier circuit according to claim 4, wherein said bias circuit has a third transistor and a fourth constant-current circuit for setting the operating current of said third transistor.

6. An audio signal amplifier circuit according to claim 5, which further includes a constant-voltage circuit and said first, second, third and fourth constant-current circuits respectively have transistors, the bases of which are connected to a constant-voltage generating terminal of said constant-voltage circuit.

7. A portable acoustic apparatus comprising a battery, a differential amplifier circuit which has a pair of transistors capable of differential operation with a predetermined bias voltage and a predetermined bias current being set for the base and which receives an audio signal to amplify the same and a bias current generator circuit that supplies the bases of said pair of transistors with bias currents of substantially the same value, said bias current generator circuit comprising:

a dummy circuit having a transistor with a substantially equivalent load to one member of said transistor pair and which is biased in an equivalent relationship to said one transistor;

a current mirror in which the base of an input transistor is not diode connected but connected to the base of an output transistor and supplied at the collector or emitter with a drive current flowing to the base of said transistor in said dummy circuit and in which said output transistor supplies each of the bases of said pair of transistors with said bias current which is substantially equal to the current flowing to the base of said transistor in said dummy circuit; and a control circuit that is connected to the base of said transistor in said dummy circuit and which receives the base voltage of said transistor in said dummy circuit and said predetermined bias voltage to maintain the base of said transistor in said dummy circuit at said predetermined bias voltage, and wherein said control circuit and said bias current generator circuit operate on the power supplied from said battery.

8. A portable acoustic apparatus according to claim 7, wherein said battery consists of one unit and two output transistors are provided such that they are respectively associated with the two members of said transistor pair to supply said bias current to each of the bases of said transistors.

9. A portable acoustic apparatus according to claim 8, wherein said differential amplifier circuit has a first constant-current circuit for setting the operating current of said transistor pair, said dummy circuit has a second constant-current circuit for setting the operating current of the transistor in said dummy circuit, the current value of said second constant-current circuit is set to be substantially one half the current value of said first constant-current circuit, and said control circuit is an error amplifier which generates an error consisting essentially of the difference between the base voltage of said transistor in said dummy circuit and said predetermined bias voltage and wherein a signal representing said error is sent to the base of said input transistor.

10. A portable acoustic apparatus according to claim 9, which further includes a bias circuit for generating said predetermined bias voltage, said error amplifier is composed of a differential amplifier circuit having a first and a second transistor and a third constant-current circuit for setting the operating current of this pair of transistors, the base of said first transistor being connected to the base of said transistor in said dummy circuit, the base of said second transistor being connected to a terminal of said bias circuit for generating said predetermined bias voltage, and wherein the output of said second transistor is sent to the base of said input transistor and the current value of said third constant-current circuit is set such that a current sufficiently smaller than the current flowing to the base of said transistor in said dummy circuit will flow to the base of said first transistor.

* * * * *